(12) United States Patent
Han

(10) Patent No.: US 6,916,701 B2
(45) Date of Patent: Jul. 12, 2005

(54) METHOD FOR FABRICATING A SILICIDE LAYER OF FLAT CELL MEMORY

(75) Inventor: Chang Hun Han, Kyoungki-do (KR)

(73) Assignee: DongbuAnam Semiconductor Inc., Seoul (KR)

(*) Notice: Subject to any disclaimer, the term of this patent is extended or adjusted under 35 U.S.C. 154(b) by 0 days.

(21) Appl. No.: 10/235,773

(22) Filed: Sep. 5, 2002

(65) Prior Publication Data

US 2003/0045059 A1 Mar. 6, 2003

(30) Foreign Application Priority Data

Sep. 5, 2001 (KR) .......................... 2001-54460

(51) Int. Cl.⁷ .......................................... H01L 21/8239
(52) U.S. Cl. .................... 438/241; 438/258; 438/664
(58) Field of Search ................. 438/241, 258, 438/664, FOR 196, FOR 212

(56) References Cited

U.S. PATENT DOCUMENTS

| | | | | |
|---|---|---|---|---|
| 6,146,994 A | * | 11/2000 | Hwang | ........................ 438/633 |
| 6,162,675 A | * | 12/2000 | Hwang et al. | ............... 438/241 |
| 6,413,861 B1 | * | 7/2002 | Huang et al. | ................ 438/682 |
| 6,448,130 B1 | * | 9/2002 | Kim | ............................. 438/241 |
| 6,468,867 B1 | * | 10/2002 | Lai et al. | ..................... 438/275 |

* cited by examiner

Primary Examiner—George Fourson
(74) Attorney, Agent, or Firm—Timothy J. Keefer; Seyfarth Shaw LLP

(57) ABSTRACT

Disclosed is a method for fabricating a silicide layer of a flat cell memory device. The disclosed method comprises the steps of: providing a silicon substrate whereon a flat cell array region and a peripheral circuit region are defined; forming a word line and a bit diffusion layer on the flat cell array region of the substrate and a word line and source/drain junction on the peripheral circuit region; forming a gap fill insulating layer to fill up the gap between the word lines; removing the gap fill insulating layer on the peripheral circuit region; forming an insulating layer on the whole substrate; dry etching the insulating layer to expose a surface of word line, and a surface of the substrate of the peripheral circuit region, thereby forming a spacer on a side wall of the word line of the peripheral circuit region; and forming a silicide layer on the upper part of the word line of the flat cell array region and, at the same time, forming a salicide layer on the upper part of the word line and the surface of the substrate of the peripheral circuit region.

3 Claims, 8 Drawing Sheets

METHOD FOR FABRICATING A SILICIDE LAYER OF FLAT CELL MEMORY

BACKGROUND OF THE INVENTION

1. Field of the Invention

The present invention relates to a method for fabricating a flat cell memory device and, more particularly, to a method of fabricating a silicide layer of flat cell memory device capable of lowering electric resistance of interconnection line in a highly-integrated design rule by forming a silicide layer on a word line of flat cell region except for active region of the flat cell region and forming a salicide layer on a word line and active region of peripheral circuit region.

2. Description of the Related Art

Generally, a mask ROM is a nonvolatile device for storing information using a mask process in a device fabrication process. Even though the mask process for storing information can be performed in an isolation process or metal wiring process, it is generally performed by implanting ions into channel regions of memory cell. In this case, the ion-implanted cell has a different threshold voltage from that of non ion-implanted cell, thereby reading stored information. Generally, ROMs including the mask ROM have a flat cell structure to improve operation speed by increasing cell current.

FIG. 1 is a layout of mask ROM having a common flat cell structure, wherein a plurality of BN+ (Buried N+ channel) diffusion layers 18 are arranged with a predetermined distance in a row direction on a flat cell array region (A) of the mask ROM, and a plurality of word lines 28 are arranged with a predetermined distance in a column direction to cross with the BN+ diffusion layer 18. And, on a peripheral circuit region (B) of the mask ROM, a BN+ diffusion layer 18 is formed with a bit line contact 50 being in contact with the BN+ diffusion layer. In the drawing, a reference numeral 10 is an active region of silicon substrate and a reference numeral 40 is a code mask region. The BN+ diffusion layer 18 is used as a bit line junction and a source/drain junction of cell transistor. The word line 28 has the same width as the channel width of memory cell.

The mask ROM having the flat cell structure has an isolation layer covering the whole memory cell array region instead of isolation layer such as LOCOS (Local Oxidation of Silicon) and STI (Shallow Trench Isolation), to isolate cells in the memory cell array region. The source/drain junction of cell transistor is not isolated since the BN+ diffusion layer 18 is employed, and the contact to the BN+ diffusion layer 18 is disposed on segment selection region (that is, peripheral circuit region), instead of on the memory cell array region. Therefore, the mask ROM of flat cell structure can be advantageously applied to highly-integrated memory having the cell size of 4F2 (F indicates a minimum line width of photolithography) since there is no contact and isolation pattern in the memory cell array region.

FIGS. 2A to 2F are cross-sectional views taken along the line a–a' in FIG. 1, showing the manufacturing process of a flat cell structure mask ROM in accordance with a conventional method.

Although it is not shown in the drawings, an isolation layer is formed on peripheral circuit region B of silicon substrate 10 by a common isolation process and then, a well is formed by implanting ions into the silicon substrate. The isolation process and the well forming process can be performed in the inverse order.

Referring to FIG. 2A, a sensitive film pattern 16 is formed to have a predetermined size on a flat cell array region A of the silicon substrate 10 and then, BN+ ion implantation process is performed by using the sensitive film pattern 16 as a mask.

Referring to FIG. 2B, the sensitive film pattern is removed and annealing process is performed on the substrate to form a BN+ diffusion layer 18 and a BN oxide layer 20. The BN oxide layer 20 is grown to a predetermined thickness to prevent loss of BN+ diffusion layer 18 junction and to reduce parasitic capacitance between word line and junction.

Referring to FIG. 2C, a gate oxide layer 22 is formed on the flat cell array region A of the silicon substrate 10 and a doped polysilicon layer 24 is formed as a conductive material for gate electrode on the gate oxide layer 22. Then, on the doped polysilicon layer 24, a tungsten silicide layer 26 is formed.

Referring to FIG. 2D, the tungsten silicide layer 26, the doped polysilicon layer 24 and the gate oxide layer 22 are etched to form a word line 28 of flat cell.

Referring to FIG. 2E, an insulation layer is formed on the resulting structure and the layer is subjected to an etch back process to form a spacer 30 on a side wall of the word line 28.

Subsequently, although it is not shown in the drawings, ion implantation process is performed to isolate cells on the flat cell array region A of the resulting substrate. Then, BN+ diffusion layer 24 is formed by performing source/drain ion implantation process on the silicon substrate 10 of peripheral circuit region B, and mask and ion implantation process is performed on the flat cell array region A, thereby coding data.

Referring to FIG. 2F, an interlayer insulating layer 32 is formed on the resulting substrate and then, etched to form a bit line contact (not shown) and a bit line (not shown).

In the memory device of flat cell structure according to the conventional method, a problem has arisen that sheet resistance and contact resistance are increased by high resistance of the BN+ diffusion layer, thereby lowering the speed of the device. Therefore, to solve the problem, a silicide layer is formed on the upper part of the word line. However, it is not formed on the BN+ diffusion layer since there is a possibility of generating shorts between silicide layer and adjacent BN+ diffusion layer.

In a flat cell fabrication process of 0.35 µm technology, it is possible to have compatibility with logic process, however, it is difficult to apply logic process including dual gate and salicide processes for a highly-integrated technology of 0.25 µm or 0.18 µm and below to a flat cell fabrication process. The dual gate process has an advantage of improving P-MOS characteristics using n-type doped polysilicon by employing both n-type doped polysilicon and p-type doped polysilicon as a word line material. The salicide process means a process wherein silicide layers are formed on the active region of the silicon substrate and at the same time, on the word line to reduce electrical resistance of interconnection line.

As a result, it is required to apply dual gate and salicide processes to a flat cell fabrication of 0.25 µm or 0.18 µm and below without forming a silicide layer on the BN+ diffusion layer of the flat cell array region.

SUMMARY OF THE INVENTION

Therefore, the present invention has been made to solve the above-mentioned problem and the primary objective of the present invention is to provide a method of fabricating a silicide layer of a flat cell memory device capable of improving speed of highly-integrated device by forming a word line on the whole substrate and performing salicide process in a condition that active region except for the word line of the flat cell array region is protected by a silicide prevention layer, and the upper part of the whole word line, and active region of peripheral circuit region are exposed.

In order to achieve the objective, the present invention comprises the steps of: providing a silicon substrate whereon flat cell array region and peripheral circuit region are defined; forming a word line and a bit diffusion layer on the flat cell array region of the substrate and a word line and source/drain junction on the peripheral circuit region; forming a gap fill insulating layer to fill up the gap between the word lines; removing the gap fill insulating layer on the peripheral circuit region; performing dry etch process on the insulating layer to expose a surface of word line, and a surface of the substrate of the peripheral circuit region, thereby forming a spacer on the side wall of the word line on the peripheral circuit region; and forming a silicide layer on the word line of the flat cell array region and at the same time, forming a salicide layer on the word line and the surface of the substrate of the peripheral circuit region.

The above objects, and other features and advantages of the present invention will become more apparent after reading the following detailed description when taken in conjunction with the drawings.

DETAILED DESCRIPTION OF THE INVENTION

FIGS. 3A to 3H are drawings showing a method of fabricating a silicide layer of mask ROM having a flat cell structure according to the present invention.

Figure 1:
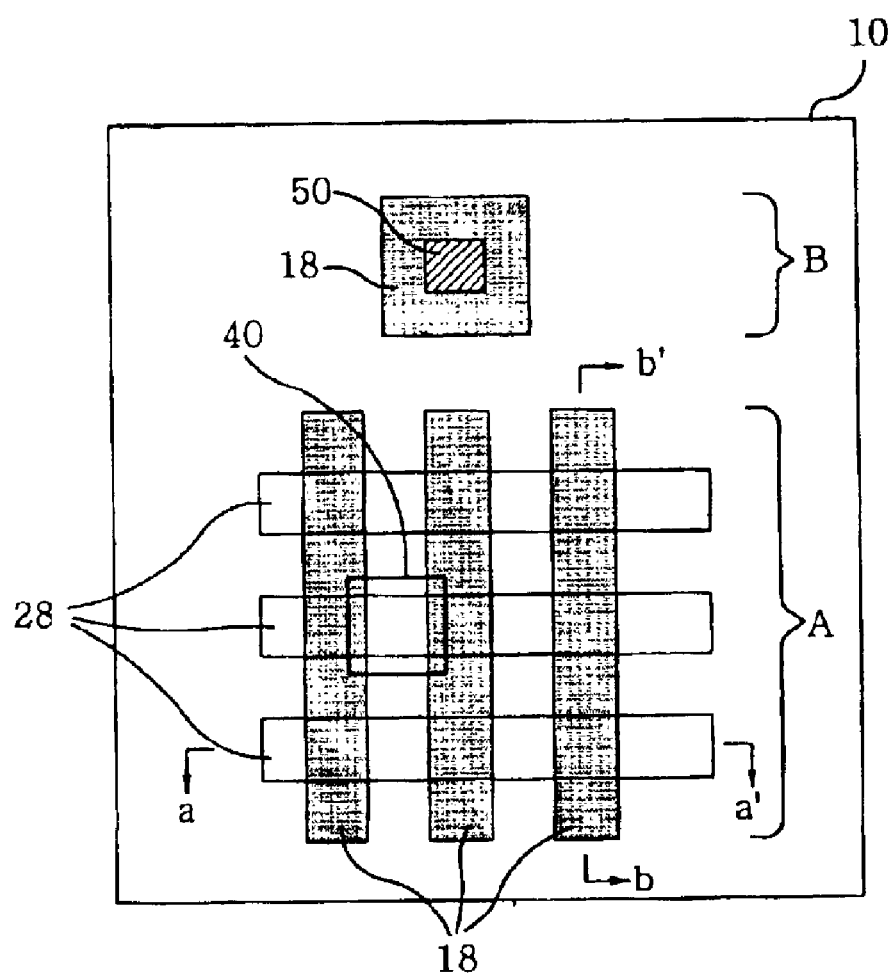
FIG. 1 is a layout of mask ROM having a conventional flat cell structure.
Figure 2A:
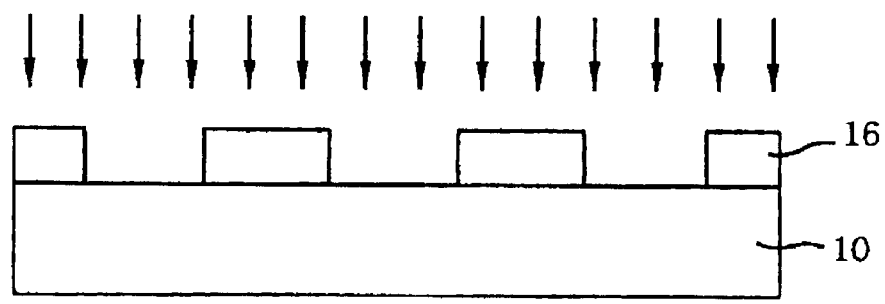
FIGS. 2A to 2F are cross-sectional views taken along the line of a–a'.
Figure 2B:
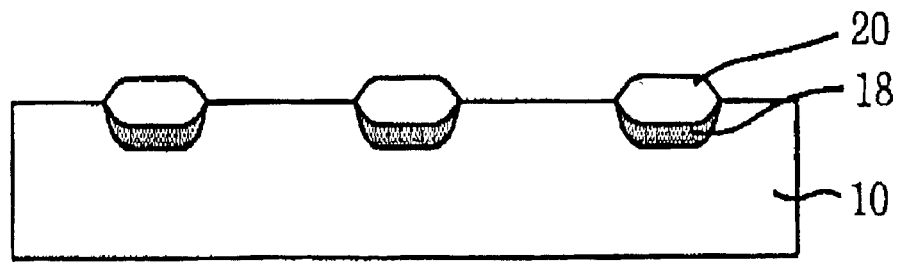
Figure 2C:
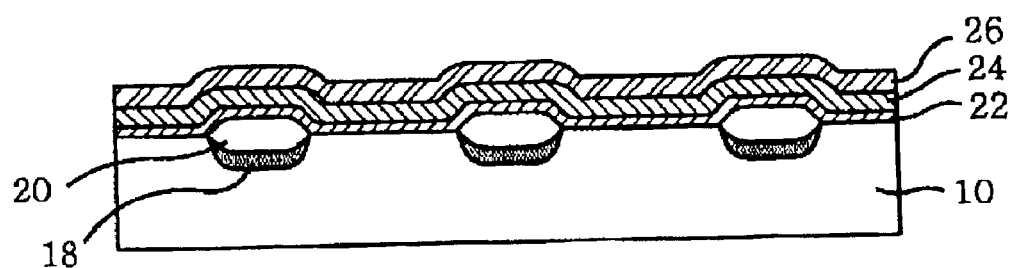
Figure 2D:
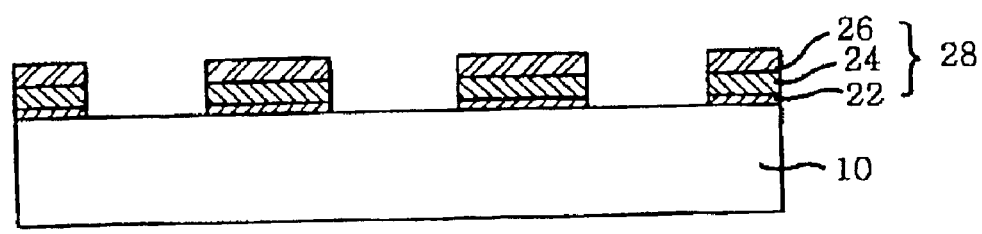
Figure 2E:
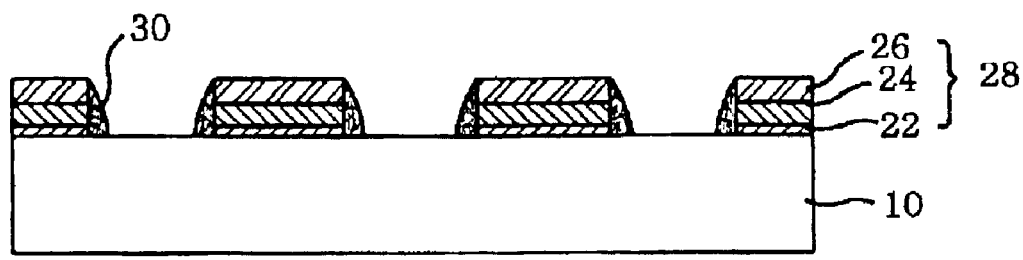
Figure 2F:
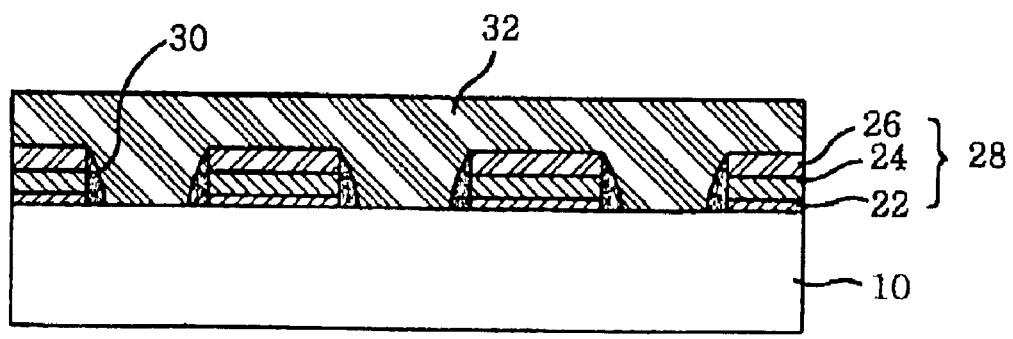
Figure 3A:
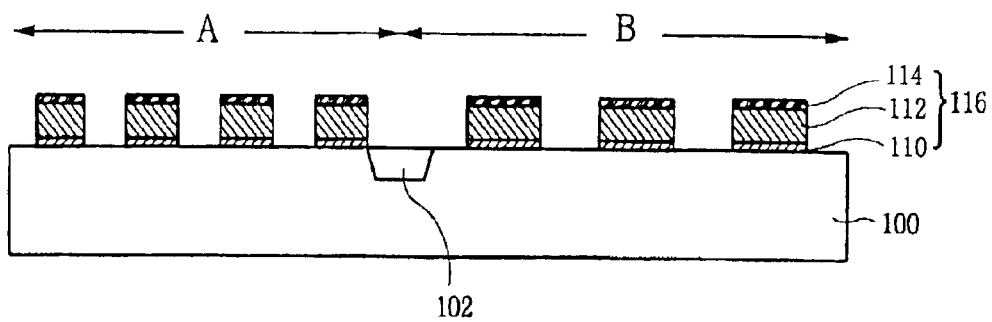
FIGS. 3A to 3H are drawings showing a method of fabricating a silicide layer of mask ROM having a flat cell structure according to the present invention.

Referring to FIG. 3A, an isolation layer 102 is formed on a peripheral circuit region B of substrate 100 in accordance with a conventional isolation process and then, a well (not shown) is formed by performing ion-implantation process on the whole substrate including the isolation layer 102. The above-mentioned processes can be performed in the inverse order.

Next, a word line 116 of flat cell is formed on the substrate, comprising a gate oxide layer 110, a doped polysilicon layer for gate electrode 112 and an etch stop layer 114. The etch stop layer 114 is formed of a material having etch selectivity relative to a gap fill insulating layer to be formed by a succeeding process. In the present embodiment, a nitride layer is employed and the thickness is in the range of 300 Å to 1000 Å in consideration of uniformity of CMP (Chemical Mechanical Polishing) process and etch target of spacer.

Subsequently, although it is not shown in the drawings, an ion implantation process is performed to isolate cells in the flat cell array region.

Figure 3B:
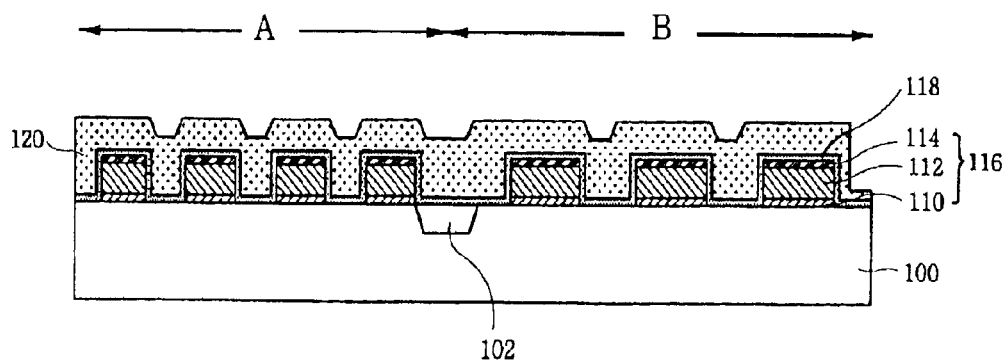

Referring to FIG. 3B, a nitride layer is deposited on the whole substrate including the word line 116 as a silicide prevention layer 118 and a TEOS layer is filled up in the gap between the word lines 116 as a gap fill insulating layer 120. The silicide prevention layer 118 and the gap fill insulating layer 120 are employed as a mask to prevent the formation of silicide on BN+ diffusion layer of the flat cell array region A. And, the silicide prevention layer 118 has a thickness of 50 Å to 1000 Å in consideration of etch selectivity to prevent damage of substrate when the gap fill insulating layer 120 of the peripheral circuit region B is removed.

Figure 3C:
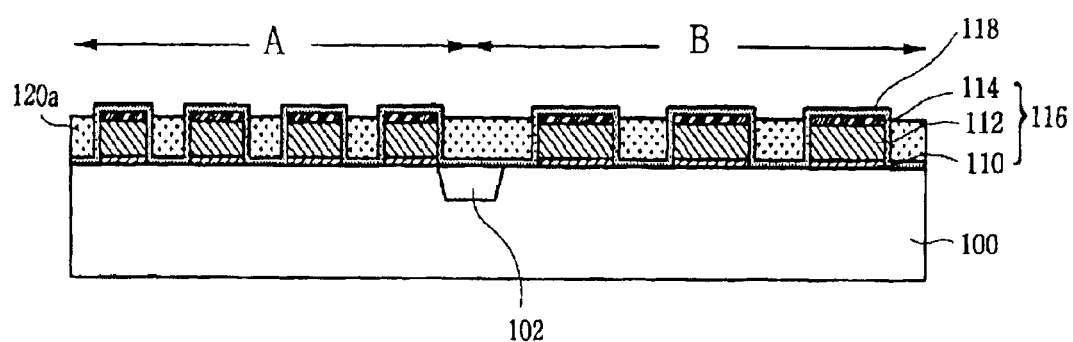

Referring to FIG. 3C, the TEOS layer 120 is polished in accordance with CMP process to expose the nitride layer for etch stop 114. Therefore, the polished TEOS layer 120a is filled up in the gap between the word lines of the flat cell array region A and the peripheral circuit region B.

Figure 3D:
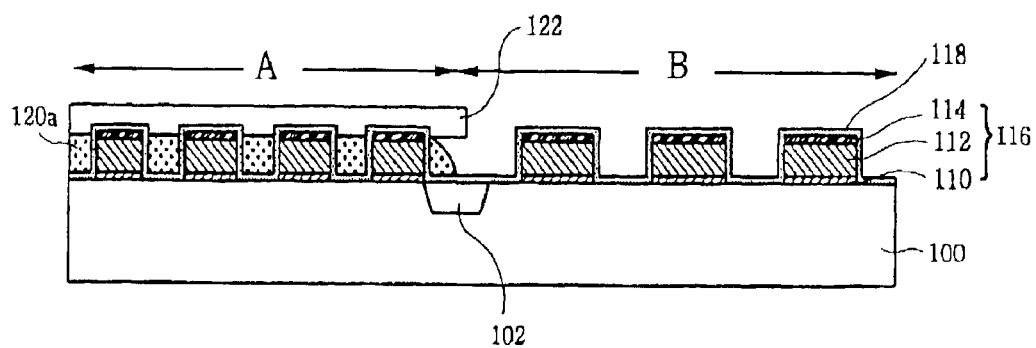

Referring to FIG. 3D, the flat cell array region A is masked with a sensitive film pattern 122 and the gap fill insulating layer 120a of the peripheral circuit region B is removed by performing wet-etch process.

A dummy pattern can be additionally formed between the word lines of the flat cell array region prior to filling up the gap fill insulating layer 120a between the word lines.

Figure 3E:
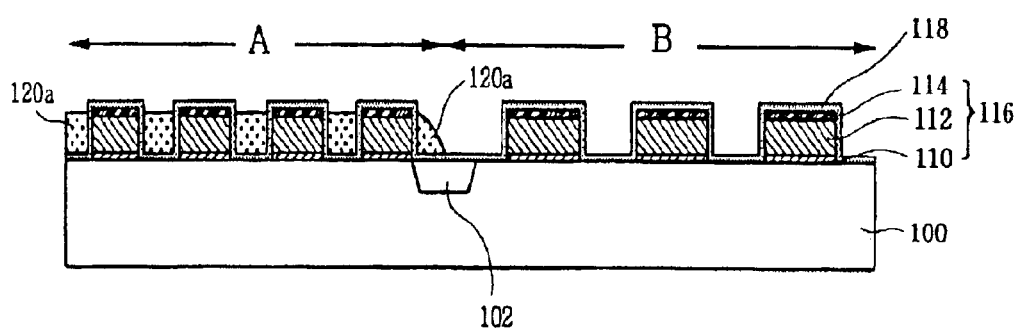

Referring to FIG. 3E, the sensitive film pattern is removed. The sensitive film pattern functions to prevent the flat cell array region, and if necessary, to form a silicide on a predetermined cell region by opening the region.

Figure 3F:
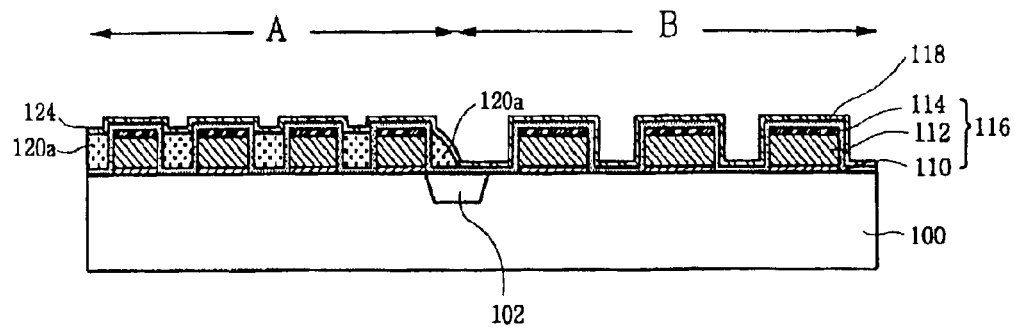
Figure 3G:
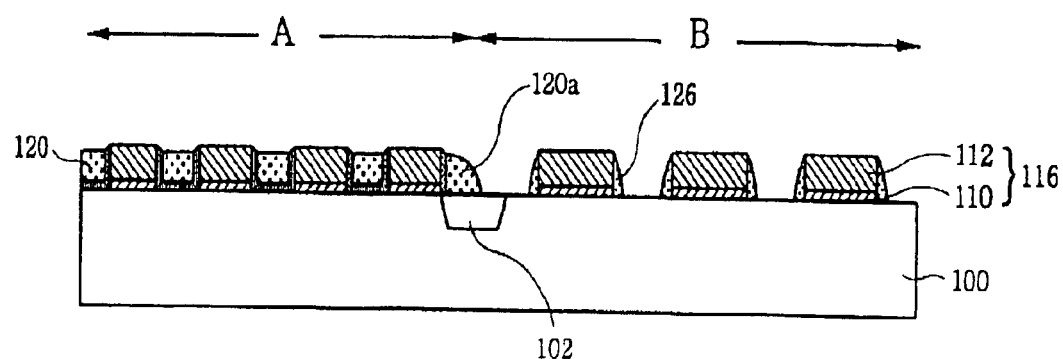

Referring to FIGS. 3F and 3G, a nitride layer 124 is deposited on the substrate as an insulating layer and then, the nitride layer 124, 114 is dry etched to expose a doped polysilicon 112 surface of word line 116, and a surface of the substrate of the peripheral circuit region B, thereby forming a spacer 126 on the side wall of the word line of the peripheral circuit region B. As the result of etch process, it is possible to expose the word line of the flat cell array region A whereon a silicide layer is to be formed, and the word line and the surface of the substrate of the peripheral circuit region B whereon a salicide layer is to be formed.

Subsequently, although it is not shown in the drawings, a BN+ diffusion layer is formed by performing source/drain ion implantation process on the peripheral circuit region B of the substrate.

Figure 3H:
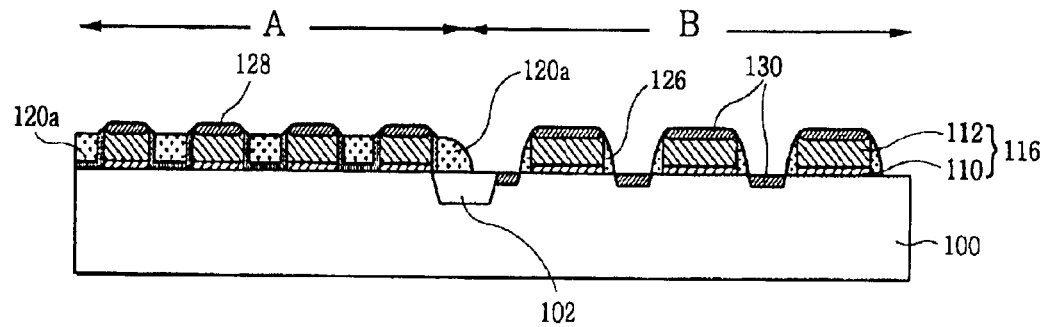

Referring to FIG. 3H, titanium (Ti) is deposited on the resulting substrate as a metal layer for silicide reaction and then, annealing process is performed to form a silicide layer 128 on the word line 116 of the flat cell array region A and at the same time, a salicide layer 130 on the word line 116 and surface of the substrate (active region) of the peripheral circuit region B. Here, Ti unreacted with silicon in the annealing process is removed and then, mask and ion implantation processes are performed on the flat cell array region A, thereby coding data. Afterwards, an interlayer insulating layer, a contact hole and an interconnection line are fabricated on the resulting silicon substrate 100, thereby forming a bit line contact and a bit line.

Therefore, according to the present invention, it is possible to reduce interconnection line resistance of word line and contact resistance of source/drain by forming a silicide layer on the dual gate type word line except for the BN+ diffusion layer of the flat cell array region and on the active region of the peripheral circuit region in applying dual gate and salicide processes required for highly-integrated device of 0.25 μm and below.

Moreover, a dummy pattern is additionally formed between the word lines of the flat cell array region to reduce the active region of large flat cell array region prior to filling up a gap fill insulating layer between the word lines, thereby improving gap fill properties.

As described above, the present invention provides a method of fabricating a memory device of flat cell structure by applying logic process including dual gate and salicide processes required for highly-integrated technology of 0.25 $\mu$M or 0.18 $\mu$m and below. According to the present invention, a dual gate type word line is formed on a silicon substrate and a salicide process is performed by protecting the substrate area (active region) expect for the word line of the flat cell array region with a silicide prevention layer, and exposing a surface of word line, and a surface of the substrate of the peripheral circuit region.

As a result, it is possible to prevent generation of shorts between adjacent parts since the salicide process is performed on the flat cell array region except for BN+ diffusion layer. And, it is also possible to reduce interconnection line resistance of word line and contact resistance of source/drain, thereby improving the speed of highly-integrated memory device since a silicide layer is formed only on the word line, and on source/drain junction region of the peripheral circuit region.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a silicide layer of a flat cell memory device comprising the steps of:

sequentially depositing a gate insulating layer, a gate electrode and an etch stop layer on a substrate of a cell array region and peripheral circuit region;

patterning the gate insulating layer, gate electrode, and etch stop layer to form a word line;

forming a nitride layer on the word line;

forming a gap fill insulating layer over the nitride layer;

applying planarization of the gap fill insulating layer using the nitride layer as a planarization stop layer, removing the gap fill insulating layer from the peripheral circuit region;

forming an insulating layer on a resulting structure;

dry etching the insulating layer to expose a surface of word line and a surface of the substrate of the peripheral circuit region, thereby forming a spacer on a side wall of the word line of the peripheral circuit region; and forming a silicide layer on the upper part of the word line of the cell array region and, at the same time, forming a silicide layer on the upper part of the word line of the peripheral circuit region and on the surface of the substrate.

2. The method according to claim 1, wherein the etch stop etch selectivity relative to the gap fill insulating layer.

3. The method according to claim 1, wherein the step of periphery circuit region uses the wet etch method.

* * * * *